United States Patent
Ungar et al.

(10) Patent No.: US 7,339,964 B2
(45) Date of Patent: Mar. 4, 2008

(54) LASER DIODE WITH PHASE MATCHING GRATING

(75) Inventors: Jeffrey E. Ungar, Valley Village, CA (US); Robert M. Lammert, Monrovia, CA (US)

(73) Assignee: Quintessence Photonics Corp., Sylmar, CA (US)

( * ) Notice: Subject to any disclaimer, the term of this patent is extended or adjusted under 35 U.S.C. 154(b) by 155 days.

(21) Appl. No.: 10/783,269

(22) Filed: Feb. 20, 2004

(65) Prior Publication Data

US 2004/0208221 A1 Oct. 21, 2004

Related U.S. Application Data

(60) Provisional application No. 60/449,766, filed on Feb. 24, 2003.

(51) Int. Cl.
*H01S 5/00* (2006.01)
*H01S 3/10* (2006.01)
*H01S 3/08* (2006.01)

(52) U.S. Cl. .................. 372/43.01; 372/22; 372/102

(58) Field of Classification Search .......... 372/96, 372/45, 43, 50, 75, 28, 26, 21, 22, 43.01, 372/102, 3, 6; 359/327
See application file for complete search history.

(56) References Cited

U.S. PATENT DOCUMENTS

| | | | |
|---|---|---|---|
| 3,816,754 A * | 6/1974 | Hodgson et al. ............. 359/327 |
| 5,757,832 A * | 5/1998 | Uchida ........................ 372/45 |
| 6,229,828 B1 * | 5/2001 | Sanders et al. ................ 372/22 |
| 6,301,271 B1 * | 10/2001 | Sanders et al. ................. 372/3 |
| 6,714,574 B2 * | 3/2004 | Clayton et al. ................ 372/50 |
| 6,775,427 B2 * | 8/2004 | Evans ......................... 385/14 |
| 6,810,067 B2 * | 10/2004 | Masood et al. ............. 372/102 |
| 6,853,666 B2 * | 2/2005 | Evans et al. .................. 372/50 |
| 2002/0054613 A1* | 5/2002 | Kang ............................ 372/6 |
| 2003/0161375 A1* | 8/2003 | Filgas et al. .................. 372/66 |
| 2005/0008056 A1* | 1/2005 | Albrecht et al. .............. 372/50 |

* cited by examiner

*Primary Examiner*—Hung Tran Vy
(74) *Attorney, Agent, or Firm*—Ben J. Yorks; Irell & Manella LLP

(57) ABSTRACT

A semiconductor diode laser that generates light at wavelengths longer than conventional diode lasers. The laser includes a first gain element that generates a first "pump" laser beam having a first optical frequency and a second gain element that generates a second "pump" laser beam having a second optical frequency. The first and second pump beams are mixed in a third section to create a wave of nonlinear polarization oscillating at the difference frequency of the first two beams. Power from this nonlinear polarization wave is coupled by a near-field phase grating to excite an electromagnetic output beam which propagates perpendicular to the laser axis. The frequency of this output beam may be much smaller than either pump beam.

11 Claims, 1 Drawing Sheet

LASER DIODE WITH PHASE MATCHING GRATING

REFERENCE TO CROSS-RELATED APPLICATION

This application claims priority to provisional application No. 60/449,766, filed on Feb. 24, 2003.

BACKGROUND OF THE INVENTION

1. Field of the Invention

The subject matter disclosed generally relates to the field of semiconductor lasers.

2. Background Information

Conventional laser diodes, which are fabricated from III-V compound semiconductors such as GaAlAs, InGaAlP and InGaAsP operate at wavelengths between 0.4 and 1.6 µm. Longer wavelengths in the mid-infrared range between 2 and 10 µm are required for important applications, including:

Optical communications in the open atmosphere, which are highly vulnerable to scattering by fog and rain at conventional diode wavelengths shorter than 2 µm. By contrast, the atmosphere is much more transparent to wavelengths around 10 µm, where attenuation through fog can be as much as 150 db/km lower.

Measures to protect civilian and military aircraft from attack by shoulder-fired missiles, which use transmission of optical pulses in the 2 to 4.5 µm band to confuse their heat-seeking guidance systems.

The presence of chemical weapons such as nerve agents, as well as environmental pollutants can be sensitively detected by monitoring atmospheric absorption of mid-infrared laser beams.

There are unfortunately no practical laser diodes in this wavelength region. Diodes using Quantum Cascade designs have been demonstrated, but these have very low efficiency and require cryogenic cooling that makes them impractical for most applications.

It would be desirable to provide a semiconductor laser that efficiently generates light in the mid-range of infrared without some or all of the drawbacks found in prior art devices.

BRIEF SUMMARY OF THE INVENTION

A semiconductor laser that includes two optical gain elements for generating light at two different optical frequencies. These gain elements are optically coupled to an optical frequency mixer that generates a polarization wave at a third optical frequency. The semiconductor laser includes a near-field phase grating that couples power from the polarization wave to an electromagnetic wave propagating at the third optical frequency.

DETAILED DESCRIPTION

Figure 1:
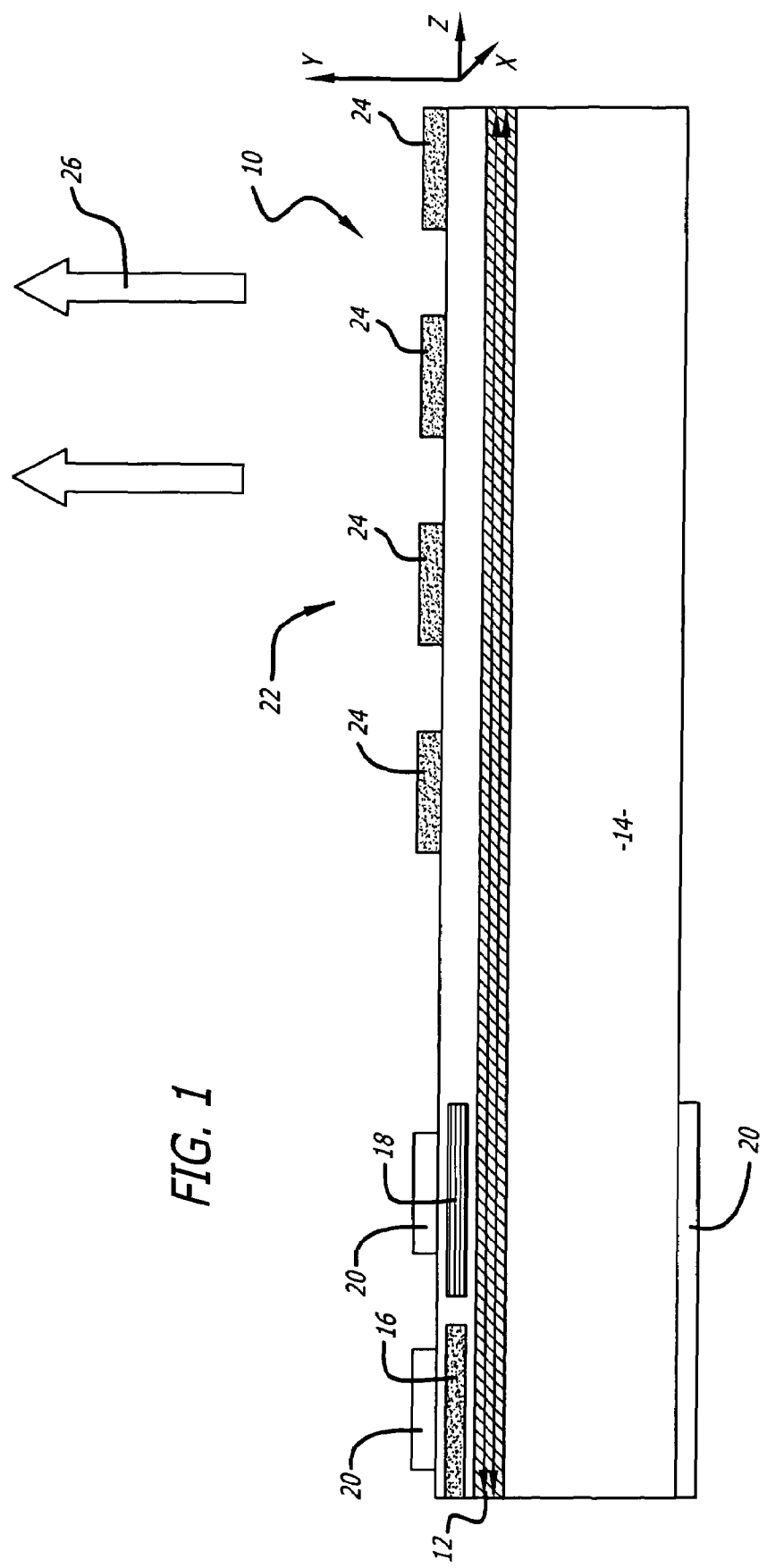
FIG. 1 is an illustration showing a side sectional view of a semiconductor laser.

Disclosed is a semiconductor diode laser that generates light at wavelengths longer than conventional diode lasers. The laser includes a first gain element that generates a first "pump" laser beam having a first optical frequency and a second gain element that generates a second "pump" laser beam having a second optical frequency. The first and second pump beams are mixed in a third section to create a wave of nonlinear polarization oscillating at the difference frequency of the first two beams.

Power from this nonlinear polarization wave is coupled by a near-field phase grating to excite an electromagnetic output beam which propagates perpendicular to the laser axis. The frequency of this output beam may be much smaller than either pump beam.

FIG. 1 shows a laser 10 that generates a beam of light typically at mid-infrared frequencies between 2 and 10 µm. Laser 10 consists of semiconductor optical waveguide 12 and adjacent optical gain sections 16 and 18 fabricated on top of semiconductor substrate 14. Optical waveguide 12 and gain sections 16 and 18 may be fabricated from epitaxial multi-layers of semiconductors such as InGaAsP and AlGaAs, as is well known in the art. Optical gain sections 16 and 18 may have alloy compositions and incorporate epitaxial layers of p and n-type semiconductors such that optical gain is generated at two distinct wavelengths when electrical current is flowed through these sections.

Each gain element 16 and 18 may incorporate a feedback element such as a diffraction grating (not shown) to support laser oscillation at the first and second frequencies. Alternatively, feedback to support laser oscillation at the first and second frequencies may be provided by Fresnel reflection at each end of the optical waveguide 12.

Additionally, gain elements 16 and 18 may be provided with metallic electrical contacts 20 to facilitate the flow of electrical current.

When current flows through elements 16 and 18, optical gain is provided at two distinct wavelengths. As a result, laser beams at the gain frequencies of elements 16 and 18 which propagate along the length of optical waveguide 12 are generated.

The nonlinear susceptibility of the semiconductors used to fabricate optical waveguide 12 creates a wave of polarization at the difference frequency between the two waves generated by elements 16 and 18. By way of example, if the first gain element 16 provides gain at 250 THz (1.2 µm) and the second gain element 18 at 182 THz (1.65 µm), a wave of polarization in waveguide 12 is generated at the difference frequency of 68 THz (4.4 µm). Waveguide 12, which is preferably grown epitaxially with a group III-V material such as InGaAsP, has strong nonlinear susceptibility, because group III-V materials have much higher nonlinear coefficients than standard ferro-electric crystals such as $LiNbO_3$ and $KH_2PO_4$.

The induced polarization wave has a spatial propagation constant that differs from a freely propagating electromagnetic wave of the same frequency, and it does not therefore directly couple power into an output beam. Phase grating 10, which consists of periodically spaced 180° phase shifters 24, is provided adjacent to waveguide 12 in order to correct this phase mismatch and couple power from the nonlinear polarization wave into an electromagnetic wave 26 propagating perpendicularly to the waveguide axis. For example, the converter length and grating period may be 3 mm and 1.5 µm, respectively, to generate an output beam with a wavelength of 4.400 nm.

The process by which power is converted from the first two laser beams to the mid-infrared difference frequency beam may be clarified by the following mathematical description. The specific directions of propagation and field polarizations are chosen for illustrative purposes only:

Let the spatial and time dependence of the electrical fields of the first and second light beams be described by the following two wave equations, respectively:

$$\text{Beam 1}: E_1 = e_x E_1 \cos(k_1 z - \omega_1 t) \quad (1)$$

$$\text{Beam 2}: E_2 = e_x E_2 \cos(k_2 z - \omega_2 t) \quad (2)$$

where;

$e_x$=unit polarization vector in x direction.
$E_1$=electric field amplitude of first light beam.
$E_2$=electric field amplitude of second light beam.
$k_1$=propagation number of the first light beam.
$k_2$=propagation number of the second light beam.
$\omega_1$=frequency of the first light beam.
$\omega_2$=frequency of the second light beam.

The propagation direction z and polarization direction x are mutually perpendicular.

If, for example, the crystal axes of the semiconductor substrate is chosen such that the x direction lies along the principal axis of the nonlinear susceptibility tensor, a polarization density wave is induced within the waveguide 12. The induced nonlinear polarization density wave is described by the equation:

$$P_{n1} = e_x E_1 E_2 \cos((k_1 - k_2)z - \omega_3 t) \quad (3)$$

where, $\omega_3 = \omega_1 - \omega_2$.

The polarization wave has a frequency $\omega_3$ that is the difference between the frequencies $\omega_1$ and $\omega_2$ of the first and second pump beams.

Because of refractive index dispersion, $k_1 - k_2$ is not equal to the spatial wave number of an electromagnetic wave with frequency $\omega_3$, and no electromagnetic wave would normally be excited. However, the diffraction grating 22 phase modulates the polarization density wave by multiplicative factor $$\cos(k_1 - k_2)z, \text{ and} \quad (4)$$

the resultant phase shifted product has the form:

$$P_{ln} = e_x E_1 E_2 \cos((\omega_1 - \omega_2)t) + (\text{out of phase terms}) \quad (5)$$

which is phase matched to an electromagnetic wave of mid-infrared frequency $\omega_3$ propagating in the y direction (perpendicular to both the propagation direction of the first two waves and their polarization vectors). The polarization wave therefore excites an output beam propagating in the perpendicular direction.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A semiconductor laser, comprising:
a substrate;
a first optical gain element that is fabricated on top of said substrate and generates a first light beam having a first optical frequency;
a second optical gain element that is fabricated on top of said substrate and generates a second light beam having a second optical frequency;
an optical frequency mixer that is coupled to said substrate and said first and second gain elements and mixes said first and second light beams to generate a polarization wave at a third optical frequency; and
a near-field phase grating that is adjacent to said first and second optical gain elements and phase modulates the polarization wave to couple a power from the polarization wave to an electromagnetic wave that propagates at the third optical frequency, the electromagnetic wave propagates in a direction essentially perpendicular to a propagation direction of the first and second light beams.

2. The laser of claim 1, wherein the third optical frequency is in the mid-infrared, long-infrared or Terahertz regions.

3. The laser of claim 1, wherein said optical frequency mixer includes a waveguide optically coupled to said first and second gain elements.

4. The laser of claim 1, wherein the semiconductor laser is fabricated with group III-V material.

5. A semiconductor laser, comprising: a substrate;
a first optical gain element that is fabricated on top of said substrate and generates a first light beam having a first frequency;
a second optical gain element that is fabricated on top of said substrate and generates a second light beam having a second frequency;
mixing means for mixing the first and second light beams to create a polarization wave at a third optical frequency and is coupled to said substrate, and;
phase modulation means for phase modulating the polarization wave for coupling a power of the polarization wave to an electromagnetic wave that propagates at the third optical frequency and is adjacent to said first and second optical gain elements, the electromagnetic wave propagates in a direction essentially perpendicular to a propagation direction of the first and second light beams.

6. The laser of claim 5, wherein the third optical frequency is in mid-infrared, long-infrared or Terahertz regions.

7. The laser of claim 5, wherein said mixing means includes a waveguide for mixing said first and second light beams.

8. The laser of claim 5, wherein the semiconductor laser is fabricated with group III-V material.

9. A method for operating a semiconductor laser, comprising:
generating a first light beam having a first optical frequency from a first optical gain element fabricated on top of a substrate;
generating a second light beam having a second optical frequency from a second optical gain element fabricated on top of the substrate;
mixing the first and second light beams to create a polarization wave at a third optical frequency, and,
phase modulating the polarization wave with a phase grating that is adjacent to the first and second optical elements to couple a power of the polarization wave to an electromagnetic wave that propagates at the third optical frequency, the electromagnetic wave propagates in a direction essentially perpendicular to a propagation direction of the first and second light beams.

10. The method of claim 9, wherein the third optical frequency is in the mid-infrared, long-infrared or Terahertz regions.

11. The method of claim 9, wherein the first and second light beams are mixed in a waveguide coupled to the substrate.

* * * * *